Figure 1:
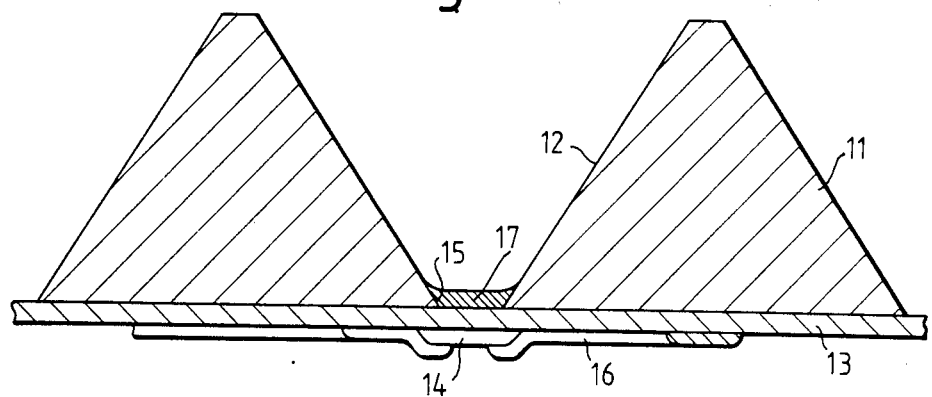

United States Patent [19]

Satchell

[11] Patent Number: 4,575,631
[45] Date of Patent: Mar. 11, 1986

[54] INFRA-RED DETECTOR

[75] Inventor: David W. Satchell, Berden, United Kingdom

[73] Assignee: International Standard Electric Corporation, New York, N.Y.

[21] Appl. No.: 640,438

[22] Filed: Aug. 13, 1984

[30] Foreign Application Priority Data

Aug. 12, 1983 [GB] United Kingdom ............... 8321807

[51] Int. Cl.$^4$ .................. H01L 31/02; H01L 31/18
[52] U.S. Cl. .................................. 250/332; 250/338; 250/349; 250/370
[58] Field of Search .............. 250/370, 338, 332, 334, 250/349, 342

[56] References Cited

U.S. PATENT DOCUMENTS 3,767,928  10/1973  Bishop et al. ............... 250/338
4,251,679  2/1981   Zwan ........................... 310/300

FOREIGN PATENT DOCUMENTS

WO82/01066  4/1982  PCT Int'l Appl. ............... 250/338

Primary Examiner—Carolyn E. Fields
Attorney, Agent, or Firm—John T. O'Halloran; Thomas P. O'Hare

[57] ABSTRACT

An infra-red detector or sensor comprises a wafer (11) of single crystal silicon in one surface of which pyramidal pits (12) forming a two-dimensional array are etched. The pits form horn aerial elements whereby radiant energy is directed to bolometers (14) one disposed at the throat of each horn.

8 Claims, 2 Drawing Figures

INFRA-RED DETECTOR

This invention relates to sensors for detecting infra-red radiation and in particular to a one or two-dimensional sensor array and to a method of fabricating the array.

Infra-red sensors are used in a variety of applications, particularly in the military field where they are employed in heat sensors and night vision devices. The efficiency of these sensors is characterised by a figure of merit known as the detectivity (D) which is calculated from the expression $$D = \frac{V_s}{V_n} \frac{\sqrt{A(\Delta f)}}{W}$$

where $V_s$ is the r.m.s. output derived from the infra-red signal, $V_n$ is the r.m.s. output generated by noise, W is the r.m.s. incident power, A is the effective detector area and $\Delta f$ is the bandwidth.

At present the most efficient detectors are photoconductive devices which have a detectivity of the order of $10^{10}$. Whilst these devices are widely used they suffer from the disadvantage that they require cooling to low temperatures. This restricts the portability and ease of operation of these devices.

Attempts have been made to overcome this problem by the use of bolometers or of pyroelectric devices which operate at ambient temperature. However these have a much lower detectivity than photoconductive sensors. The maximum value reported is $10^8$. The advantages of ambient temperature operation cannot therefore be fully realised with devices available at present.

The object of the present invention is to minimise or to overcome this disadvantage.

According to one aspect of the invention there is provided an infra-red sensor including an array of horn aerial elements formed in a body of single crystal silicon, and bolometer elements one for each horn whereby in use radiation received by that horn is detected.

According to another aspect of the invention there is provided a method of making an infra-red sensor, including masking and selectively etching the surface of a silicon wafer to form a series of pyramidal etch pits, each pit providing a horn aerial element the throat of which is disposed at the other surface of the wafer, coating the other surface of the wafer with an insulating material, mounting bolometer elements on said layer, one in register with the throat of each horn element, and providing electrical contact to the bolometer elements.

Typically the aerial horn array is formed by etching pyramidal pits in the surface of a single crystal silicon body. The horns have a substantial gain relative to single dipoles, typically 28dB and so provide a sensor of high detectivity. The arrangement couples the received radiation to small bolometers having dimensions of the order of one wavelength, e.g. 10 microns. This provides a very compact and robust detector arrangement.

Figure 2:
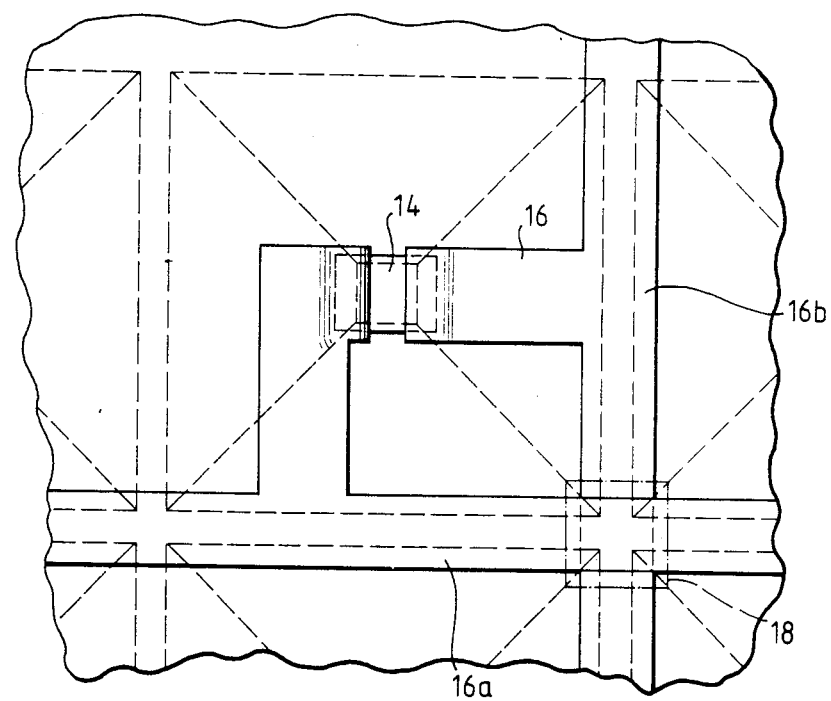

An embodiment of the invention will now be described with reference to the accompanying drawings in which:

FIG. 1 is a cross-section of a portion of the infra-red detector array;

and FIG. 2 is a plan schematic view of an element of the detector array of FIG. 1.

Referring to the drawings, the infra-red detector comprises a body of single crystal silicon 11 in which a one or two dimensional array of pyramidal pits 12 is etched by a selective etching process. The selective etching process in (100) single crystal silicon produces structures bounded by flat planes with included angles of 90° in the plane of the wafer and 35° 12' normal to the plane of the wafer, this latter angle being uniquely determined by the crystallography of the material. By marking a 100 surface of a silicon wafer with a mask having an array of square openings followed by selective etching a corresponding array of pyramidal pits is obtained. The throat 15 of each horn is disposed at the lower surface of the water.

Pure silicon is transparent in the 3 to 14 micron waveband but has a high permittivity so that the pits 12 function as dielectric horns. Alternatively the surface of each pit may be coated with a metal layer (not shown) to provide a conductive horn aerial.

The silicon wafer carrying the array of horn aerials is provided on its undersurface with an insulating layer 13 of silicon oxide or silicon nitride. On the underside of this insulating layer 13 bolometer elements 14 are mounted one in register with each horn throat 15. Each bolometer element 14 comprises a thin metallic film, e.g. of gold, bismuth or nickel, and is contacted by metal film conductors 16. Heat transfer from each horn to the respective bolometer may be enhanced by the application of a heat absorbing material 17 such as gold black to the throat of the horn.

As shown in FIG. 2 the connections to the bolometers form a rectangular array of column conductors 16a and row conductors 16b mutually isolated by cross-over insulation regions 18. Each element of the array may thus be addressed individually to provide a thermal image pattern. To facilitate addressing of the array diodes other active components (not shown) may be incorporated in the silicon wafer by conventional techniques.

The sensor device may be used as an infra red image sensor in a variety of applications. In particular it may be used in night vision equipment or in heat seeking devices.

I claim:

1. An infra-red sensor comprising a body of single crystal silicon having a plurality of horn aerial elements formed therein, and a plurality of bolometer elements each of said bolometer elements being mounted adjacent to one of said horn aerial elements for detecting radiation received by said horn aerial elements.

2. A sensor as claimed in claim 1, wherein each bolometer element comprises a film of gold, bismuth or nickel.

3. A sensor as claimed in claim 1, wherein the bolometer elements are disposed on a silicon nitride or silicon oxide or silica layer formed on the silicon body.

4. A sensor as claimed in claim 1, wherein said horn aerial elements are coated with a conductive material.

5. A sensor as claimed in claim 1, wherein said horn aerial elements form a two-dimensional array.

6. A night vision device incorporating an infra-red sensor comprising a body of single crystal silicon having a plurality of horn aerial elements formed therein, and a plurality of bolometer elements each of said bolometer elements being mounted adjacent to one of said horn aerial elements for detecting radiation received by said horn aerial elements 7. A method of making an infra-red sensor, comprising the steps of masking and selectively etching a surface of a silicon wafer to form a series of pyramidal etch pits, each of said pits providing a horn aerial element having a throat which is disposed at the bottom of the pit, coating the other surface of the wafer with an insulating material layer, mounting a plurality of bolometer elements on said layer, one of said elements adjacent to and in register with the throat of each horn element, and providing electrical contact to the bolometer elements.

8. A method as claimed in claim 7, wherein said insulating material is selected from the group consisting of silica and silicon nitride and silicon oxide.

* * * * *